United States Patent
Sasaki et al.

(10) Patent No.: US 7,905,958 B2
(45) Date of Patent: Mar. 15, 2011

(54) GROUP III-NITRIDE SEMICONDUCTOR CRYSTAL AND MANUFACTURING METHOD THEREOF, AND GROUP III-NITRIDE SEMICONDUCTOR DEVICE

(75) Inventors: Takatomo Sasaki, Suita (JP); Yusuke Mori, Katano (JP); Masashi Yoshimura, Takarazuka (JP); Fumio Kawamura, Minoh (JP); Seiji Nakahata, Itami (JP); Ryu Hirota, Itami (JP)

(73) Assignees: Sumitomo Electric Industries, Ltd., Osaka (JP); Yusuke Mori, Osaka (JP)

( * ) Notice: Subject to any disclaimer, the term of this patent is extended or adjusted under 35 U.S.C. 154(b) by 1164 days.

(21) Appl. No.: 11/579,645

(22) PCT Filed: Mar. 30, 2005

(86) PCT No.: PCT/JP2005/006076
§ 371 (c)(1),
(2), (4) Date: Nov. 6, 2006

(87) PCT Pub. No.: WO2005/111278
PCT Pub. Date: Nov. 24, 2005

(65) Prior Publication Data
US 2008/0283968 A1    Nov. 20, 2008

(30) Foreign Application Priority Data
May 19, 2004  (JP) ................................. 2004-148923

(51) Int. Cl.
*C30B 21/02*    (2006.01)
(52) U.S. Cl. ................. 117/81; 117/78; 117/79; 117/83
(58) Field of Classification Search .................... 117/81, 117/78, 79, 83
See application file for complete search history.

(56) References Cited

U.S. PATENT DOCUMENTS

| | | | |
|---|---|---|---|
| 6,398,867 B1 * | 6/2002 | D'Evelyn et al. | ............... 117/11 |
| 6,413,627 B1 | 7/2002 | Motoki et al. | |
| 6,562,124 B1 | 5/2003 | Ivantzov et al. | |
| 6,592,663 B1 * | 7/2003 | Sarayama et al. | .............. 117/68 |
| 2002/0175338 A1 | 11/2002 | Sarayama et al. | |

(Continued)

FOREIGN PATENT DOCUMENTS

CN    1288079    3/2001

(Continued)

OTHER PUBLICATIONS

Balkas, C.M. et al., "Growth and characterization of GaN single crystals," Journal of Crystal Growth, vol. 208, No. 1-4, Jan. 1, 2000, pp. 100-106.

(Continued)

*Primary Examiner* — Robert M Kunemund
(74) *Attorney, Agent, or Firm* — McDermott Will & Emery LLP

(57) ABSTRACT

A method of manufacturing group III-nitride semiconductor crystal includes the steps of accommodating an alloy containing at least a group III-metal element and an alkali metal element in a reactor, introducing a nitrogen-containing substance in the reactor, dissolving the nitrogen-containing substance in an alloy melt in which the alloy has been melted, and growing group III-nitride semiconductor crystal is provided. The group III-nitride semiconductor crystal attaining a small absorption coefficient and an efficient method of manufacturing the same, as well as a group III-nitride semiconductor device attaining high light emission intensity can thus be provided.

8 Claims, 5 Drawing Sheets

U.S. PATENT DOCUMENTS

| | | |
|---|---|---|
| 2004/0124434 A1 | 7/2004 | D'Evelyn et al. |
| 2004/0183090 A1* | 9/2004 | Kitaoka et al. ................ 257/103 |

FOREIGN PATENT DOCUMENTS

| | | |
|---|---|---|
| CN | 1748290 | 3/2006 |
| EP | 1 439 572 A | 7/2004 |
| EP | 1 634 980 A | 3/2006 |
| GB | 2 326 160 A | 12/1998 |
| JP | 2000-12900 A | 1/2000 |
| JP | 2001-102316 | 4/2001 |
| JP | 2004-224600 | 8/2004 |
| JP | 2005-119893 | 5/2005 |

OTHER PUBLICATIONS

European Search Report issued in European Patent Application No. EP 05727904.4-1215 dated Jan. 27, 2009.

Chinese Office Action, with English Translation, with Chinese Patent Application No. CN 200580016039.1, dated Jun. 20, 2008.

"GaN Single Crystal Growth by th Flux Method," Hisanori Yamane, et. al., Oyo Buturi, The Japan Society of Applied Physics, May 2002, vol. 71, No. 5, pp. 548-552.

* cited by examiner

GROUP III-NITRIDE SEMICONDUCTOR CRYSTAL AND MANUFACTURING METHOD THEREOF, AND GROUP III-NITRIDE SEMICONDUCTOR DEVICE

RELATED APPLICATIONS

This application is the U.S. National Phase under 35 U.S.C. §371 of International Application No. PCT/JP2005/006076, filed on Mar. 30, 2005, which in turn claims the benefit of JP 2004-148923, filed on May 19, 2004, the disclosures of which Applications are incorporated by reference herein.

TECHNICAL FIELD

The present invention relates to group III-nitride semiconductor crystal attaining a small absorption coefficient and an efficient method of manufacturing the same, as well as to a group III-nitride semiconductor device attaining high light emission intensity.

BACKGROUND ART

A sapphire substrate, a GaN substrate or the like is used as a substrate for a semiconductor device such as a light emitting diode (hereinafter referred to as LED) or a laser diode (hereinafter referred to as LD).

As the sapphire substrate attains high insulation, it is not possible to provide an electrode on a back surface of the sapphire substrate (referring to a surface of the substrate where a semiconductor layer having a light emission layer is not formed, hereinafter the same as above). Therefore, not only a p-side electrode but also an n-side electrode should be formed on the semiconductor layer which is formed on the sapphire substrate. In such a case, as a result of a current passing through the semiconductor layer having a small thickness, a drive voltage of a light emission device has undesirably been high.

In contrast, since the GaN substrate may be provided with an electrode also on its back surface, the drive voltage of the light emission device can be lowered. Meanwhile, an absorption coefficient of the GaN substrate is larger than that in the sapphire substrate, and a part of light emission is absorbed in the GaN substrate in an LED or the like, which results in lower light emission intensity. In order to solve this problem, a method of manufacturing a GaN crystal substrate attaining high transparency and a low absorption coefficient by using vapor phase growth such as HVPE (Hydride Vapor Phase Epitaxy) as well as a GaN crystal substrate obtained through that manufacturing method have been proposed. The absorption coefficient of that GaN crystal substrate, however, is not sufficiently small (see, for example, Japanese Patent Laying-Open No. 2000-12900 (Patent Document 1)).

Meanwhile, a method of manufacturing a GaN crystal substrate using a flux method in which GaN crystal grows through the steps of accommodating metal Na representing an alkali-metal-element-containing substance and metal Ga representing a group III-metal-element-containing substance in a reactor, melting these metals to form a melt containing an alkali metal element and a group III-metal element, and introducing $N_2$ gas representing a nitrogen-containing substance into the melt has been proposed. The GaN crystal substrate obtained through the flux method, however, is also colored orange or brown, and the absorption coefficient of that GaN crystal substrate is not sufficiently small (see, for example, Hisanori Yamane, et al., "GaN Single Crystal Growth by the Flux Method," Oyo Buturi, The Japan Society of Applied Physics, May, 2002, Vol. 71, No. 5, pp. 548-552 (Non-Patent Document 1)).

This may be because metal Na representing an alkali-metal-element-containing substance is highly susceptible to oxidation, i.e., an oxygen atom or the like is introduced as an impurity atom, and therefore it is difficult to obtain high-purity group III-nitride semiconductor crystal.

In addition, a nitrogen atom (hereinafter referred to as N atom) is hardly dissolved in a melt of a simple substance of Ga and a melt of a simple substance of Na. Therefore, when metal Ga and metal Na are simply melted, Ga atom and Na atom mix merely slowly with each other and dissolution of the N atom in the melt is not expedited. Namely, it takes a long time before crystal growth of GaN crystal starts.

Therefore, efficient manufacturing of a GaN crystal substrate attaining a low absorption coefficient, which will serve as a substrate for a semiconductor device such as an LED or an LD, has been desired.

Patent Document 1: Japanese Patent Laying-Open No. 2000-12900

Non-Patent Document 1: Hisanori Yamane, et al., "GaN Single Crystal Growth by the Flux Method," Oyo Buturi, The Japan Society of Applied Physics, May, 2002, Vol. 71, No. 5, pp. 548-552

DISCLOSURE OF THE INVENTION

Problems to be Solved by the Invention

In view of the situation as described above, an object of the present invention is to provide group III-nitride semiconductor crystal attaining a small absorption coefficient and an efficient method of manufacturing the same, as well as a group III-nitride semiconductor device attaining high light emission intensity.

Means for Solving the Problems

According to one aspect of the present invention, a method of manufacturing group III-nitride semiconductor crystal includes the steps of: accommodating an alloy containing at least a group III-metal element and an alkali metal element in a reactor; introducing a nitrogen-containing substance in the reactor; dissolving the nitrogen-containing substance in an alloy melt in which the alloy has been melted; and growing group III-nitride semiconductor crystal.

In the method of manufacturing group III-nitride semiconductor crystal according to the present invention, after the alloy containing at least the group III-metal element and the alkali metal element is accommodated in the reactor, the reactor may be subjected to heat treatment and the alloy melt in which the alloy has been melted may be stirred.

According to another aspect of the present invention, a method of manufacturing group III-nitride semiconductor crystal includes the steps of: accommodating at least a group III-metal-element-containing substance and an alkali-metal-element-containing substance in a reactor; introducing a nitrogen-containing substance in the reactor; stirring a melt in which the group III-metal-element-containing substance and the alkali-metal-element-containing substance have been melted; dissolving the nitrogen-containing substance in the melt; and growing group III-nitride semiconductor crystal.

In the method of manufacturing group III-nitride semiconductor crystal according to the present invention, stirring may be carried out by at least any one of stirring by means of a propeller, stirring by rotating the reactor, stirring by rotating an underlying substrate and the group III-nitride semiconductor crystal that grows on the underlying substrate, and stirring by introducing a gas for stirring.

According to yet another aspect of the present invention, group III-nitride semiconductor crystal manufactured with the method of manufacturing group III-nitride semiconductor crystal is provided. The group III-nitride semiconductor crystal according to the present invention may attain an absorption coefficient, in a wavelength range from 375 nm to 500 nm, of at most 50 $cm^{-1}$.

In addition, the present invention is directed to a group III-nitride semiconductor device including the group III-nitride semiconductor crystal.

Effects of the Invention

As described above, according to the present invention, group III-nitride semiconductor crystal attaining a small absorption coefficient and an efficient method of manufacturing the same, as well as a group III-nitride semiconductor device attaining high light emission intensity can be provided.

Figure 1:
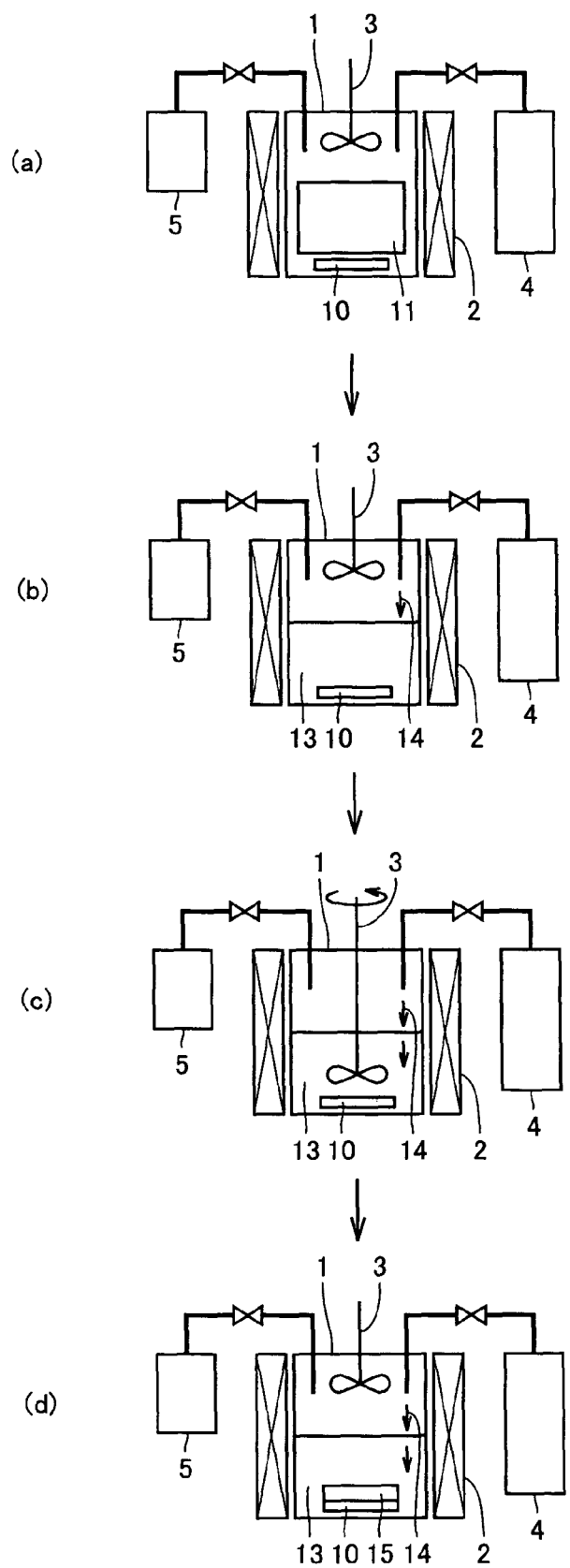
FIG. 1 is a schematic diagram of a method of manufacturing group III-nitride semiconductor crystal according to the present invention; (a) shows accommodation of at least an alloy in a reactor and heat treatment of the reactor; (b) shows introduction of a nitrogen-containing substance into the reactor and formation of an alloy melt; (c) shows stirring of the alloy melt; and (d) shows growth of the group III-nitride semiconductor crystal.

DESCRIPTION OF THE REFERENCE CHARACTERS 1 reactor; 2 heater; 3 stirring apparatus; 4 nitrogen-containing substance supply apparatus; 5 evacuation apparatus; 6 rotation axis; 9 stirring gas supply apparatus; 10 underlying substrate; 11 alloy; 13 alloy melt; 14 nitrogen-containing substance; 15 group III-nitride semiconductor crystal; 21 group III-metal-element-containing substance; 22 alkali-metal-element-containing substance; 23, 33 melt; 39 gas for stirring; 40 group III-nitride semiconductor crystal substrate; 41 n-type GaN layer; 42 $In_{0.2}Ga_{0.8}N$ layer; 43 $Al_{0.2}Ga_{0.8}N$ layer; 44 p-type GaN layer; 45 p-side electrode; 46 n-side electrode; 50 light emission; and 400 group III-nitride semiconductor device.

BEST MODES FOR CARRYING OUT THE INVENTION

Embodiment 1

Referring to FIG. 1, a method of manufacturing group III-nitride semiconductor crystal according to the present invention includes the steps of: accommodating an alloy 11 containing at least a group III-metal element and an alkali metal element in a reactor 1; introducing a nitrogen-containing substance 14 in reactor 1; dissolving nitrogen-containing substance 14 in an alloy melt 13 in which alloy 11 has been melted; and growing group III-nitride semiconductor crystal 15.

By accommodating alloy 11 containing at least the group III-metal element and the alkali metal element in the reactor, introduction of an oxygen atom (hereinafter referred to as O atom) into the group III-nitride semiconductor crystal is suppressed, as compared with a case in which an alkali-metal-element-containing substance susceptible to oxidation is directly accommodated in the reactor. Therefore, the group III-nitride semiconductor crystal attaining a small absorption coefficient is obtained.

In addition, atoms of the group III-metal element and atoms of the alkali metal element have already been mixed in alloy melt 13 that is obtained by melting alloy 11, and the mixture has attained an equilibrium state. As nitrogen-containing substance 14 introduced into reactor 1 is readily dissolved in alloy melt 13, a time until the group III-nitride semiconductor crystal starts to grow after alloy melt 13 is formed and hence a time for crystal growth can be shortened.

Here, the group III-metal element refers to an element belonging to group 13 in the long periodic table, such as Al, Ga, In, and the like. Meanwhile, the alkali metal element refers to a metal element belonging to group 1 in the long periodic table, such as Li, Na, K, and the like. The alloy containing at least the group III-metal element and the alkali metal element refers to an alloy in an equilibrium state as a result of mixing of at least the atoms of the group III-metal element and the atoms of the alkali metal element. A chemical composition ratio in the alloy and a texture thereof are not particularly limited, and a solid solution, a eutectic (eutectic mixture), a compound (intermetallic compound), or co-existence of those may be encompassed. In addition, the nitrogen-containing substance refers to a substance containing a nitrogen atom serving as a material for forming group III-nitride semiconductor crystal, such as $N_2$ gas, $NH_3$ gas, and the like.

Figure 5:
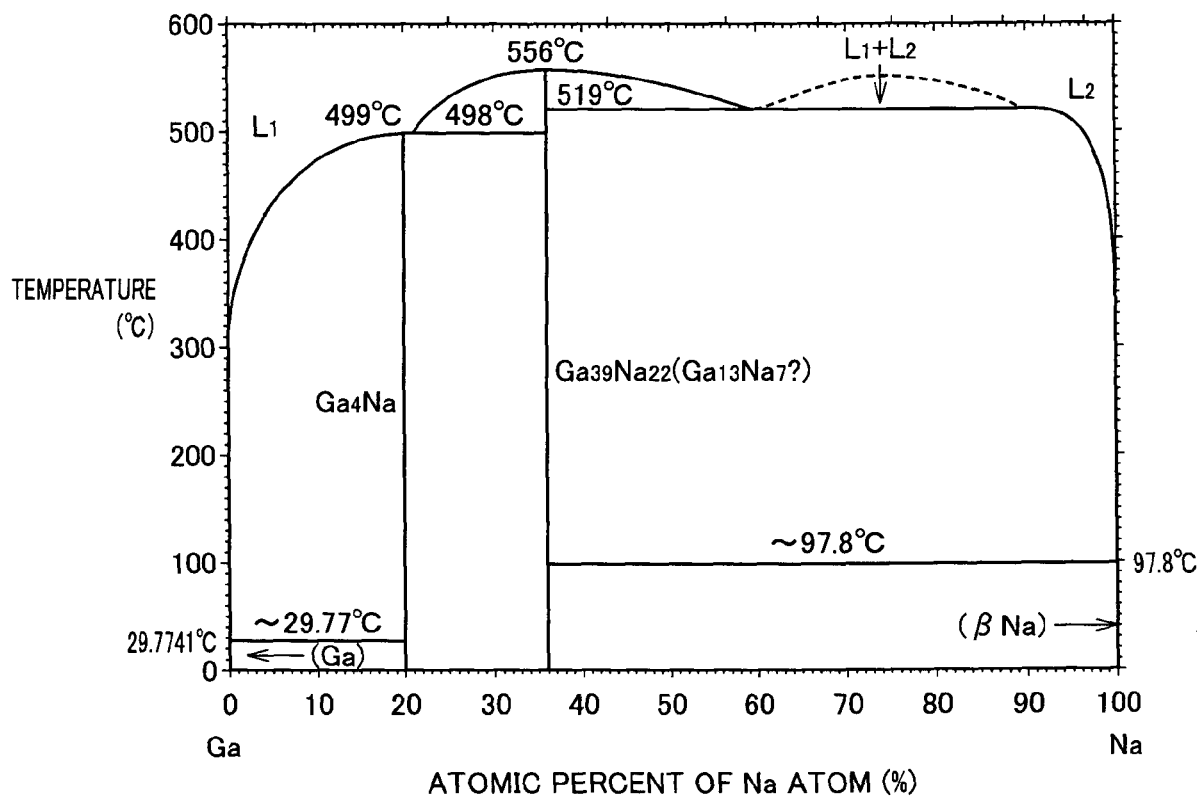
FIG. 5 is a diagram showing an equilibrium state of a Ga—Na alloy.

A method of manufacturing alloy 11 is not particularly limited, and the alloy may be obtained by melting each metal, mixing well the melted metals, and thereafter solidifying the same. For example, referring to FIG. 5, metal Ga and metal Na (Ga atom:Na atom=80:20) are melted at a temperature not lower than 500° C. and mixed well, and thereafter the melt is cooled to obtain an alloy consisting of one phase having a composition of $Ga_4Na$ at a temperature not higher than 499° C. Alternatively, referring to FIG. 5, metal Ga and metal Na (Ga atom:Na atom=50:50) are melted at a temperature not lower than 560° C. and mixed well, followed by cooling. Then, $Ga_{39}Na_{22}$ is precipitated at 556° C. and Na is solidified at 97.8° C., whereby an alloy consisting of two phases having compositions of $Ga_{39}Na_{22}$ and Na respectively is obtained.

The method of manufacturing the group III-nitride semiconductor crystal according to the present invention will further specifically be described with reference to FIG. 1. Initially, as shown in FIG. 1(a), an underlying substrate 10 and alloy 11 containing the group III-metal element and the alkali metal element are accommodated in reactor 1. Then, as shown in FIG. 1(b), nitrogen-containing substance 14 is introduced from a supply apparatus 4 into reactor 1. Reactor 1 is heated by a heater 2 disposed around an outer circumference of reactor 1, so as to melt alloy 11 and obtain alloy melt 13. Then, as shown in FIG. 1(d), nitrogen-containing substance 14 is dissolved in alloy melt 13, so as to grow group III-nitride semiconductor crystal 15 on underlying substrate 10. It is noted that a procedure for accommodating the underlying substrate and the alloy and introducing the nitrogen-containing substance is not limited as above. For example, though not shown, the procedure may be such that the alloy is accommodated in the reactor and heated and melted by means of the heater, the underlying substrate is then accommodated in the reactor, and thereafter the nitrogen-containing substance is introduced.

The underlying substrate is not particularly limited. From a viewpoint of improvement in lattice matching of the crystal, however, a homo-type substrate implemented by group III-nitride semiconductor crystal of the same type as group III-nitride semiconductor crystal that desirably grows is preferably employed. Even if a hetero-type substrate is employed as a main body of the underlying substrate, such a substrate that a layer of group III-nitride semiconductor crystal of the same type as group III-nitride semiconductor crystal that desirably grows is formed on a surface where at least group III-nitride semiconductor crystal is to grow can preferably be employed. For example, when GaN crystal is to grow, an underlying substrate in which a GaN crystal layer is formed on a surface of a sapphire substrate can preferably be employed.

In Embodiment 1, as shown in FIG. 1(a), preferably, moisture in reactor 1 is removed by subjecting reactor 1 to heat treatment after underlying substrate 10 and alloy 11 containing the group III-metal element and the alkali metal element are accommodated in reactor 1 and before nitrogen-containing substance 14 is introduced into reactor 1. By removing moisture within reactor 1, introduction of an O atom or the like into the group III-nitride semiconductor crystal is further suppressed, and the group III-nitride semiconductor crystal attaining a further smaller absorption coefficient is obtained.

More specifically, referring to FIG. 1(a), after underlying substrate 10 and alloy 11 containing the group III-metal element and the alkali metal element are accommodated in reactor 1, reactor 1 is evacuated by means of an evacuation apparatus 5. Then, heater 2 is used for heat treatment of reactor 1, so that moisture in underlying substrate 10, alloy 11 and reactor 1 is removed. Here, preferably, in reactor 1, a degree of vacuum is set to at most 1330 Pa (10 Torr), a treatment temperature is set to 100 to 500° C., and a treatment duration is set to 0.1 to 5 hours. If the degree of vacuum in the reactor exceeds 1330 Pa, a speed at which moisture is removed is lowered. If the treatment temperature is lower than 100° C., a speed at which moisture is removed is lowered. Meanwhile, if the treatment temperature exceeds 500° C., atoms of the alkali metal element evaporate from the alloy. If the treatment duration is shorter than 0.1 hour, an amount of removed moisture becomes small. Meanwhile, even if the treatment duration exceeds 5 hours, an amount of removed moisture is not increased.

In Embodiment 1, as shown in FIG. 1(c), preferably, alloy melt 13 in which alloy 11 has been melted is stirred. As a result of stirring, mixing of the group III-metal element atoms and the alkali metal element atoms in alloy melt 13 is further promoted, and therefore dissolution of the nitrogen atom into alloy melt 13 is further promoted. In addition, depending on a ratio of atom between the group III-metal element atoms and the alkali metal element atoms that compose alloy 11, alloy 11 and hence alloy melt 13 consisting of two or more phases different in chemical composition may be formed. In such a case, as a result of stirring, mixing of the group III-metal element atoms and the alkali metal element atoms in alloy melt 13 is particularly promoted, and therefore dissolution of the nitrogen atom into alloy melt 13 is particularly promoted.

Figure 3A:
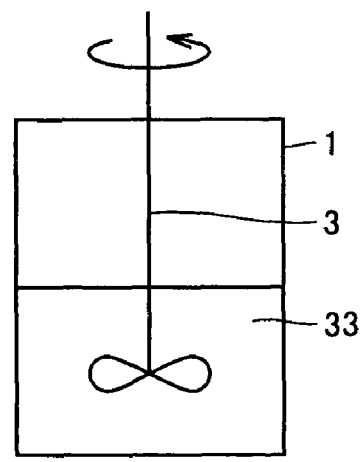
FIG. 3A is a schematic diagram of a method of stirring the melt with a propeller.
Figure 3B:
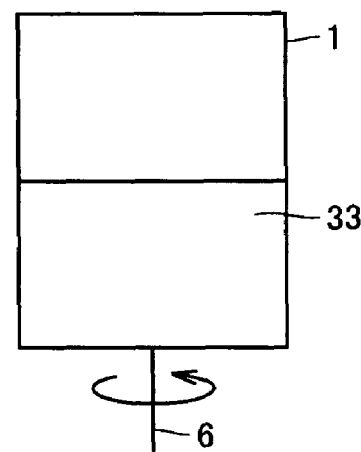
FIG. 3B is a schematic diagram of a method of stirring the melt by utilizing rotation of the reactor.

FIG. 1 shows, as a stirring apparatus 3, a propeller stirring apparatus that carries out stirring by rotating a propeller, however, a method of stirring alloy melt 13 is not particularly limited. Referring to FIGS. 3A to 3F, preferred specific examples of the method of stirring a melt 33 will be described. Examples of the preferred method of stirring melt 33 include: a method of stirring melt 33 by means of the propeller stirring apparatus serving as stirring apparatus 3 as shown in FIG. 3A (propeller stirring method); a method of stirring melt 33 by providing a rotation axis 6 in reactor 1 accommodating melt 33 and by rotating reactor 1 as shown FIG. 3B (stirring method utilizing rotation of the reactor); a method of stirring by introduction of a gas for stirring 39 from a stirring gas supply apparatus 9 into melt 33 accommodated in reactor 1, for bubbling of melt 33 as shown FIG. 3C (stirring method by introduction of the gas for stirring); a method of stirring melt 33 by providing rotation axis 6 in underlying substrate 10 and by rotating the underlying substrate and the group III-nitride semiconductor crystal that grows on the underlying substrate as shown FIGS. 3D to 3F; and the like. Rotation axis 6 of underlying substrate 10 extends upward from reactor 1 in FIG. 3D, extends downward from reactor 1 in FIG. 3E, and extends toward a side of reactor 1 in FIG. 3F. In FIGS. 3D and 3E, a part of underlying substrate 10 may appear outside melt 33.

Figure 3C:
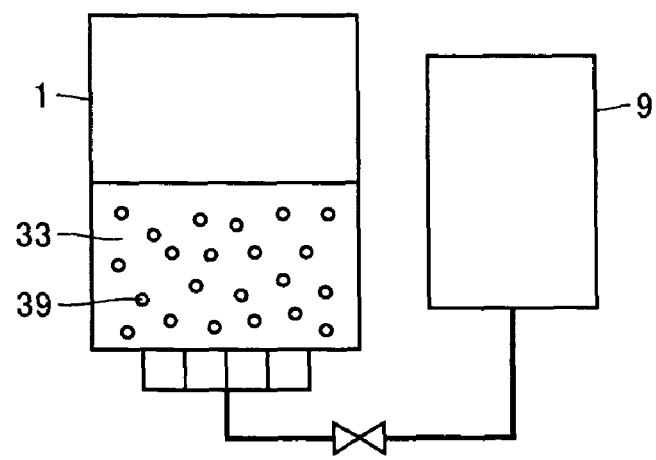
FIG. 3C is a schematic diagram of a method of stirring the melt by introduction of a gas for stirring.
Figure 3D:
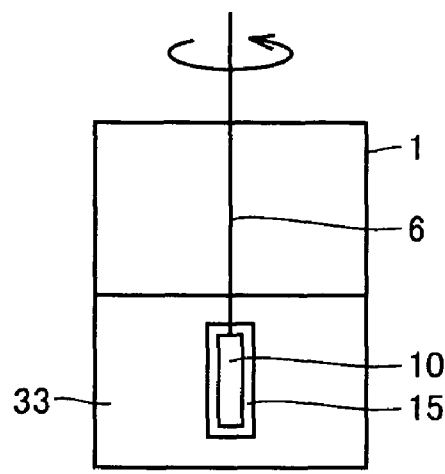
FIG. 3D is a schematic diagram of a method of stirring the melt by utilizing rotation of an underlying substrate and the group III-nitride semiconductor crystal that grows on the underlying substrate.
Figure 3E:
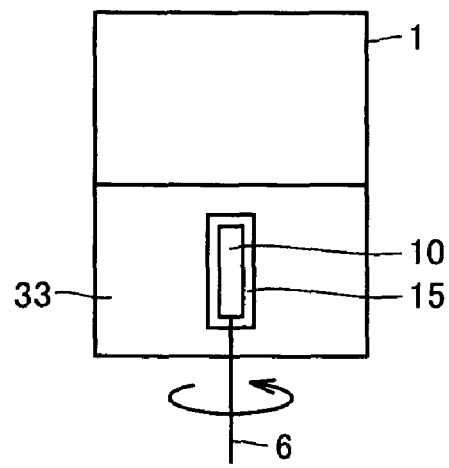
FIG. 3E is a schematic diagram of another method of stirring the melt by utilizing rotation of the underlying substrate and the group III-nitride semiconductor crystal that grows on the underlying substrate.

In the stirring method by introduction of the gas for stirring shown in FIG. 3C, an inert gas such as Ar or He that does not affect crystal growth of the group III-nitride semiconductor crystal may be employed as the gas for stirring. Alternatively, a nitrogen-containing gas such as $N_2$ gas or $NH_3$ gas may be employed as the gas for stirring, so as to simultaneously realize stirring of melt 33 and introduction of the nitrogen-containing substance into melt 33.

Embodiment 2

Figure 2:
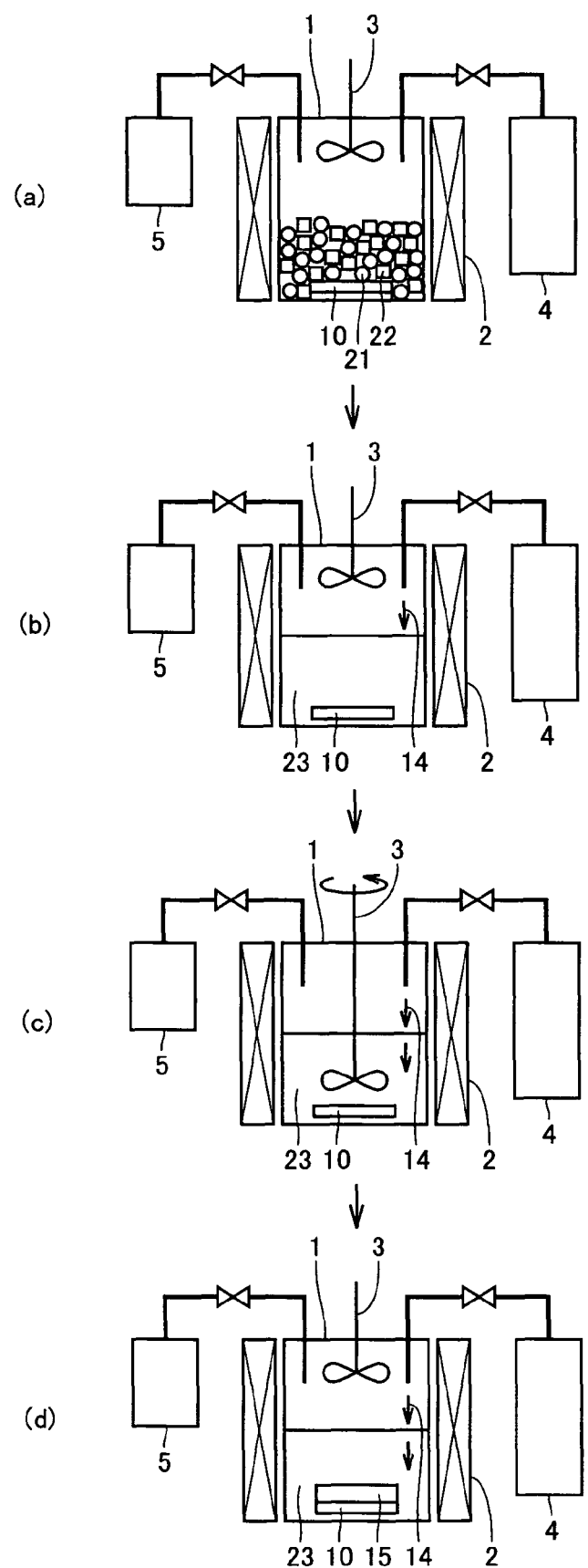
FIG. 2 is a schematic diagram of another method of manufacturing group III-nitride semiconductor crystal according to the present invention; (a) shows accommodation of at least a group III-nitride-containing substance and an alkali-metal-element-containing substance in a reactor and heat treatment of the reactor; (b) shows introduction of a nitrogen-containing substance into the reactor and formation of a melt; (c) shows stirring of the melt; and (d) shows growth of the group III-nitride semiconductor crystal.

Referring to FIG. 2, another method of manufacturing group III-nitride semiconductor crystal according to the present invention includes the steps of: accommodating at least a group III-metal-element-containing substance 21 and an alkali-metal-element-containing substance 22 in reactor 1; introducing nitrogen-containing substance 14 in reactor 1; stirring a melt 23 in which group III-metal-element-containing substance 21 and alkali-metal-element-containing substance 22 have been melted; dissolving nitrogen-containing substance 14 in melt 23; and growing group III-nitride semiconductor crystal 15. Melt 23 is forcibly stirred, so that the group III-metal element atoms and the alkali metal element atoms in melt 23 can be mixed well and dissolution of nitrogen-containing substance 14 into melt 23 is promoted. Therefore, a time until the group III-nitride semiconductor crystal starts to grow and a time for growth can be shortened. In addition, as a result of a shorter time until the group III-nitride semiconductor crystal starts to grow and a shorter time for growth, introduction of an impurity atom such as an O atom or the like into the group III-nitride semiconductor crystal is suppressed, and manufacturing of the group III-nitride semiconductor crystal attaining a small absorption coefficient is facilitated.

Here, the group III-metal-element-containing substance refers to a substance containing a group III-metal element, and encompasses not only a simple substance such as metal Ga, metal Al, metal In, and the like but also a Ga compound, an Al compound, an In compound, and the like. Meanwhile, the alkali-metal-element-containing substance refers to a substance containing an alkali metal element, and encompasses not only a simple substance such as metal Na, metal Li, metal K, and the like but also an Na compound, an Li compound, a K compound, and the like.

In the present embodiment as well, a method of stirring melt 23 is not particularly limited. As shown in FIGS. 3A to 3F, a method of stirring by means of the propeller (FIG. 3A), a stirring method by rotating the reactor (FIG. 3B), a method utilizing introduction of the gas for stirring (FIG. 3C), a method of stirring by rotating the underlying substrate and the group III-nitride semiconductor crystal that grows on the underlying substrate (FIGS. 3D to 3F), and the like are preferably employed.

Another method of manufacturing the group III-nitride semiconductor crystal according to the present invention will further specifically be described with reference to FIG. 2. Initially, as shown in FIG. 2(a), at least group III-metal-element-containing substance 21 and alkali-metal-element-containing substance 22 are accommodated in reactor 1. Then, as shown in FIG. 2(b), nitrogen-containing substance 14 is introduced from nitrogen supply apparatus 4 into reactor 1. Reactor 1 is heated by heater 2 disposed around the outer circumference of reactor 1, so as to form melt 23 in which group III-metal-element-containing substance 21 and alkali-metal-element-containing substance 22 are melted. Then, as shown in FIG. 2(c), melt 23 is stirred by means of stirring apparatus 3 or the like. Thereafter, as shown in FIG. 2(d), nitrogen-containing substance 14 is dissolved in melt 23, to grow group III-nitride semiconductor crystal 15 on underlying substrate 10.

As described above, the group III-nitride semiconductor crystal obtained through the method of manufacturing the group III-nitride semiconductor crystal according to Embodiment 1 or Embodiment 2 can attain an absorption coefficient, in a wavelength range from 375 nm to 500 nm, of at most 50 $cm^{-1}$. The group III-nitride semiconductor device including as a substrate the group III-nitride semiconductor crystal attaining an absorption coefficient, in a wavelength range from 375 nm to 500 nm, of at most 50 $cm^{-1}$ attains high light emission intensity.

Embodiment 3

Figure 4:
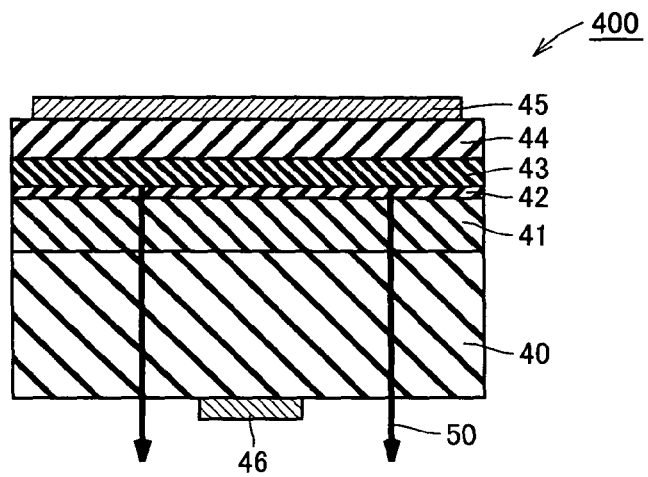
FIG. 4 is a schematic cross-sectional view of a group III-nitride semiconductor device according to the present invention.

Referring to FIG. 4, the group III-nitride semiconductor device according to the present invention implements an LED, in which an n-type GaN layer 41, an $In_{0.2}Ga_{0.8}N$ layer 42, an $Al_{0.2}Ga_{0.8}N$ layer 43, and a p-type GaN layer 44 are successively formed as the group III-nitride crystal semiconductor layer on a group III-nitride semiconductor crystal substrate 40 implemented by the group III nitride semiconductor crystal, a p-side electrode 45 is formed on an upper surface of p-type GaN layer 44, and an n-side electrode 66 is formed in the center of a lower surface of group III-nitride semiconductor crystal substrate 40. The group III-nitride semiconductor device gives off light emission 50. The group III-nitride semiconductor device employing the group III-nitride semiconductor crystal substrate that attains an absorption coefficient, in a wavelength range from 375 nm to 500 nm, of at most 50 $cm^{-1}$ attains improved light emission intensity.

EXAMPLES

Example 1

Referring to FIG. 1, as shown in FIG. 1(a), alloy 11 having a chemical composition of $Ga_{39}Na_{22}$ (Ga atom:Na atom=64:36) and a GaN/sapphire substrate (hereinafter referred to as GaN/S substrate) serving as underlying substrate 10 in which a GaN crystal layer is formed to a thickness of 2 µm on a surface of the sapphire substrate having a size of 10 mm×15 mm×400 µm thickness with MOCVD (Metal Organic Chemical Vapor Deposition) were accommodated in reactor 1. Then, reactor 1 was subjected to heat treatment by means of heater 2 for 0.5 hour at a degree of vacuum of 133 Pa (1 Torr) and at a temperature of 300° C., so as to remove moisture in alloy 11, underlying substrate 10 and reactor 1. Then, as shown in FIG. 1(b), after $N_2$ gas representing nitrogen-containing substance 14 was introduced in reactor 1, reactor 1 was set to 800° C. and 5 MPa, to melt alloy 11 and obtain alloy melt 13. $N_2$ gas was dissolved in alloy melt 13, and crystals were grown on the GaN crystal layer of underlying substrate 10 for 50 hours. As shown in FIG. 1(d), GaN crystal that has grown to a thickness of 510 µm was obtained as group III-nitride semiconductor crystal 15. The obtained crystal was identified as the GaN crystal by using XRD (X-ray diffraction). The absorption coefficient of the GaN crystal was measured, using a spectrophotometer. The GaN crystal attained the absorption coefficient, at a wavelength of 375 nm, of 28 $cm^{-1}$, and attained the absorption coefficient, at a wavelength of 500 nm, of 4 $cm^{-1}$.

Referring to FIG. 4, a GaN crystal substrate cut from the GaN crystal and having a thickness of 350 µm was employed as group III-nitride semiconductor crystal substrate 40, on which n-type GaN layer 41 having a thickness of 5 µm, $In_{0.2}Ga_{0.8}N$ layer 42 having a thickness of 3 nm, $Al_{0.2}Ga_{0.8}N$ layer 43 having a thickness of 60 nm, and p-type GaN layer 44 having a thickness of 150 nm were successively formed with MOCVD, and p-side electrode 45 having a thickness of 100 nm was formed on the upper surface of p-type GaN layer 44. Then, the lower surface of group III-nitride semiconductor crystal substrate 40 was polished, such that group III-nitride semiconductor crystal substrate 40 has a thickness of 150 µm. Thereafter, n-side electrode 46 having a diameter of 80 µm and a thickness of 100 nm was formed at a position in the center of the lower surface of group III-nitride semiconductor crystal substrate 40 (the center of each chip when the substrate is divided into chips), and the substrate was divided into chips each having a size of 500 µm×500 µm, thereby implementing group III-nitride semiconductor device 400. As a result of measurement of emission spectrum of the group III-nitride semiconductor device by using a spectrophotometer, the light emission peak wavelength of the device attained to 450 nm, and the relative light emission intensity thereof at the light emission peak wavelength attained to 1.3, as compared with 1.0 of the group III-nitride semiconductor device in Comparative Example 1 which will be described later. The result is summarized in Table 1.

Example 2

The group III-nitride semiconductor crystal was grown as in Example 1, except that an alloy having a chemical composition of $Ga_4Na$ (Ga atom:Na atom=80:20) was employed as the alloy. GaN crystal having a thickness of 440 μm was thus obtained. The GaN crystal attained the absorption coefficient, at a wavelength of 375 nm, of 36 cm$^{-1}$, and attained the absorption coefficient, at a wavelength of 500 nm, of 9 cm$^{-1}$. In addition, the GaN crystal substrate obtained by cutting the GaN crystal to a thickness of 350 μm was used to fabricate the group III-nitride semiconductor device, as in Example 1. This device attained the light emission peak wavelength of 450 nm, and the relative light emission intensity of 1.2. The result is summarized in Table 1.

Example 3

The group III-nitride semiconductor crystal was grown as in Example 1, except that an alloy having a chemical composition of $GaLi_2$ (Ga atom:Li atom=33:67) was employed as the alloy, except that the GaN substrate having a size of 14 mm×14 mm×350 μm thickness was employed as the underlying substrate, and except that the treatment temperature was set to 130° C. and the treatment duration was set to 1 hour as the conditions for heat treatment of the reactor. GaN crystal having a thickness of 490 μm was thus obtained. The GaN crystal attained the absorption coefficient, at a wavelength of 375 nm, of 30 cm$^{-1}$, and attained the absorption coefficient, at a wavelength of 500 nm, of 6 cm$^{-1}$. In addition, the GaN crystal substrate obtained by cutting the GaN crystal to a thickness of 350 μm was used to fabricate the group III-nitride semiconductor device, as in Example 1. This device attained the light emission peak wavelength of 450 nm, and the relative light emission intensity of 1.2. The result is summarized in Table 1.

Example 4

The group III-nitride semiconductor crystal was grown as in Example 1, except that an alloy having a chemical composition of $Al_2Li_3$ (Al atom:Li atom=40:60) was employed as the alloy, except that the treatment temperature was set to 130° C. and the treatment duration was set to 1 hour as the conditions for heat treatment of the reactor, and except that the growth temperature of the group III-nitride semiconductor crystal was set to 950° C. and the growth pressure thereof was set to 10 MPa. AlN crystal having a thickness of 270 μm was thus obtained. The AlN crystal attained the absorption coefficient, at a wavelength of 375 nm, of 4 cm$^{-1}$, and attained the absorption coefficient, at a wavelength of 500 nm, of 2 cm$^{-1}$. In addition, the AlN crystal substrate obtained by cutting the AlN crystal to a thickness of 200 μm was used to fabricate the group III-nitride semiconductor device, as in Example 1. This device attained the light emission peak wavelength of 450 nm, and the relative light emission intensity of 1.2. The result is summarized in Table 1.

Example 5

Referring to FIG. 2, as shown in FIG. 2(a), metal Ga representing group III-metal-element-containing substance 21, metal Na representing alkali-metal-element-containing substance 22 (Ga atom:Na atom=64:36), and the GaN substrate having a size of 14 mm×14 mm×350 μm serving as underlying substrate 10 were accommodated in reactor 1. Then, as shown in FIG. 2(b), after N$_2$ gas representing nitrogen-containing substance 14 was introduced in reactor 1, reactor 1 was set to 800° C. and 5 MPa, to form melt 23 in which metal Ga and metal Na were melted. As shown in FIGS. 2(c) and 2(d), N$_2$ gas was dissolved in melt 23, and crystals were grown on the GaN substrate serving as underlying substrate 10 for 50 hours. As shown in FIG. 2(c), for initial 0.5 hour out of 50 hours set as the crystal growth duration, the propeller stirring apparatus was used as stirring apparatus 3 to stir melt 23 at 30 rpm. The GaN crystal having a thickness of 360 μm was thus obtained as group III-nitride semiconductor crystal 15. The GaN crystal attained the absorption coefficient, at a wavelength of 375 nm, of 32 cm$^{-1}$, and attained the absorption coefficient, at a wavelength of 500 nm, of 7 cm$^{-1}$. In addition, the GaN crystal substrate obtained by cutting the GaN crystal to a thickness of 350 μm was used to fabricate the group III-nitride semiconductor device, as in Example 1. This device attained the light emission peak wavelength of 450 nm, and the relative light emission intensity of 1.3. The result is summarized in Table 1.

Example 6

The group III-nitride semiconductor crystal was grown as in Example 5, except that the GaN/S substrate in which the GaN crystal layer was formed to a thickness of 3 μm on the surface of the sapphire substrate having a size of 20 mm×20 mm×400 μm thickness with MOCVD was employed as underlying substrate 10, and except that stirring of the melt was carried out by rotating reactor 1 at 20 rpm for 1 hour. GaN crystal having a thickness of 320 μm was thus obtained. The GaN crystal attained the absorption coefficient, at a wavelength of 375 nm, of 33 cm$^{-1}$, and attained the absorption coefficient, at a wavelength of 500 nm, of 7 cm$^{-1}$. In addition, the GaN crystal substrate obtained by cutting the GaN crystal to a thickness of 250 μm was used to fabricate the group III-nitride semiconductor device, as in Example 1. This device attained the light emission peak wavelength of 450 nm, and the relative light emission intensity of 1.3.

Example 7

The group III-nitride semiconductor crystal was grown as in Example 5, except that the GaN/S substrate in which the GaN crystal layer was formed to a thickness of 3 μm on the surface of the sapphire substrate having a size of 20 mm×20 mm×400 μm thickness with MOCVD was employed as underlying substrate 10, and except that stirring of the melt was carried out by bubbling for 1 hour by means of N$_2$ gas serving as gas for stirring 39 in the 5 cm$^3$ melt in reactor 1 at 0.3 sccm (sccm is a unit designating a flow rate (cm$^3$) of a gas per 1 minute in standard conditions (1013 hPa, 0° C.)). GaN crystal having a thickness of 340 μm was thus obtained. The GaN crystal attained the absorption coefficient, at a wavelength of 375 nm, of 32 cm$^{-1}$, and attained the absorption coefficient, at a wavelength of 500 nm, of 8 cm$^{-1}$. In addition, the GaN crystal substrate obtained by cutting the GaN crystal to a thickness of 250 μm was used to fabricate the group III-nitride semiconductor device, as in Example 1. This device attained the light emission peak wavelength of 450 nm, and the relative light emission intensity of 1.2. The result is summarized in Table 1.

Example 8

The group III-nitride semiconductor crystal was grown as in Example 5, except that alloy 11 having a chemical composition of $Ga_{39}Na_{22}$ (Ga atom:Na atom=64:36) and metal Na were accommodated in reactor 1 such that a ratio between Ga atom and Na atom was set to 50:50, except that the GaN/S substrate in which the GaN crystal layer was formed to a thickness of 3 μm on the surface of the sapphire substrate having a size of 20 mm×20 mm×400 μm thickness with MOCVD was employed as reactive underlying substrate 10, and except that the melt was stirred by the propeller stirring apparatus for 50 hours (as long as the crystal growth duration) (that is, crystal growth was carried out with the melt being stirred). GaN crystal having a thickness of 570 μm was thus obtained. The GaN crystal attained the absorption coefficient, at a wavelength of 375 nm, of 30 $cm^{-1}$, and attained the absorption coefficient, at a wavelength of 500 nm, of 6 $cm^{-1}$. In addition, the GaN crystal substrate obtained by cutting the GaN crystal to a thickness of 350 μm was used to fabricate the group III-nitride semiconductor device, as in Example 1. This device attained the light emission peak wavelength of 450 nm, and the relative light emission intensity of 1.2. The result is summarized in Table 2.

Example 9

Referring to FIG. 1, as shown in FIG. 1(*a*), alloy 11 having a chemical composition of $Ga_{39}Na_{22}$ (Ga atom:Na atom=64:36) and the GaN substrate serving as underlying substrate 10 having a size of 13 mm×13 mm×350 μm thickness were accommodated in reactor 1. Then, reactor 1 was subjected to heat treatment by means of heater 2 for 0.5 hour at a degree of vacuum of 133 Pa (1 Torr) and at a temperature of 300° C., so as to remove moisture in alloy 11, underlying substrate 10 and reactor 1. Then, as shown in FIG. 1(*b*), after $N_2$ gas representing nitrogen-containing substance 14 was introduced in reactor 1, reactor 1 was set to 800° C. and 5 MPa, to melt alloy 11 and obtain alloy melt 13. As shown in FIGS. 2(*c*) and 2(*d*), $N_2$ gas was dissolved in melt 23, and crystals were grown on the GaN substrate serving as underlying substrate 10 for 50 hours. As shown in FIG. 1(*c*), for initial 0.5 hour out of 50 hours set as the crystal growth duration, the propeller stirring apparatus was used as stirring apparatus 3 to stir alloy melt 13 at 20 rpm. GaN crystal having a thickness of 540 μm was thus obtained as group III-nitride semiconductor crystal 15. The GaN crystal attained the absorption coefficient, at a wavelength of 375 nm, of 28 $cm^{-1}$, and attained the absorption coefficient, at a wavelength of 500 nm, of 4 $cm^{-1}$. In addition, the GaN crystal substrate obtained by cutting the GaN crystal to a thickness of 350 μm was used to fabricate the group III-nitride semiconductor device, as in Example 1. This device attained the light emission peak wavelength of 450 nm, and the relative light emission intensity of 1.3. The result is summarized in Table 2.

Example 10

The group III-nitride semiconductor crystal was grown as in Example 9, except that an alloy having a chemical composition of $Al_2Li_3$ (Al atom:Li atom=40:60) was employed as the alloy, except that the GaN/S substrate in which the GaN crystal layer was formed to a thickness of 3 μm on the surface of the sapphire substrate having a size of 25 mm×20 mm×350 μm thickness with MOCVD was employed as the underlying substrate, except that the treatment temperature was set to 130° C. and the treatment duration was set to 1 hour as the conditions for heat treatment of the reactor, and except that the growth temperature of the group III-nitride semiconductor crystal was set to 950° C. and the growth pressure thereof was set to 10 MPa. AlN crystal having a thickness of 290 μm was thus obtained. The AlN crystal attained the absorption coefficient, at a wavelength of 375 nm, of 4 $cm^{-1}$, and attained the absorption coefficient, at a wavelength of 500 nm, of 2 $cm^{-1}$. In addition, the GaN crystal substrate obtained by cutting the AlN crystal to a thickness of 200 μm was used to fabricate the group m-nitride semiconductor device, as in Example 1. This device attained the light emission peak wavelength of 450 nm, and the relative light emission intensity of 1.3. The result is summarized in Table 2.

Example 11

The group III-nitride semiconductor crystal was grown as in Example 5, except that the GaN substrate having a size of 15 mm×15 mm×2 mm thickness was employed as underlying substrate 10 and except that the crystal growth was performed for 100 hours while stirring the melt with the GaN substrate being rotated at 10 rpm as shown in FIG. 3D using a normal line passing through the center of a 15 mm×2 mm plane of the GaN substrate as rotation axis 6. GaN crystal having a thickness of 700 μm was thus obtained. The GaN crystal attained the absorption coefficient, at a wavelength of 375 nm, of 30 $cm^{-1}$, and attained the absorption coefficient, at a wavelength of 500 nm, of 6 $cm^{-1}$. In addition, the GaN crystal substrate obtained by cutting the GaN crystal to a thickness of 350 μm was used to fabricate the group III-nitride semiconductor device, as in Example 1. This device attained the light emission peak wavelength of 450 nm, and the relative light emission intensity of 1.2. The result is summarized in Table 2.

Example 12

The group III-nitride semiconductor crystal was grown as in Example 5, except that the GaN substrate having a size of 15 mm×15 mm×2 mm thickness was employed as underlying substrate 10, and except that the crystal growth was performed for 100 hours while stirring the melt with the GaN substrate being rotated at 10 rpm as shown in FIG. 3E using a normal line passing through the center of the 15 mm×2 mm plane of the GaN substrate as rotation axis 6. GaN crystal having a thickness of 900 μm was thus obtained. The GaN crystal attained the absorption coefficient, at a wavelength of 375 nm, of 29 $cm^{-1}$, and attained the absorption coefficient, at a wavelength of 500 nm, of 7 $cm^{-1}$. In addition, the GaN crystal substrate obtained by cutting the GaN crystal to a thickness of 350 μm was used to fabricate the group III-nitride semiconductor device, as in Example 1. This device attained the light emission peak wavelength of 450 nm, and the relative light emission intensity of 1.2. The result is summarized in Table 2.

Example 13

Figure 3F:
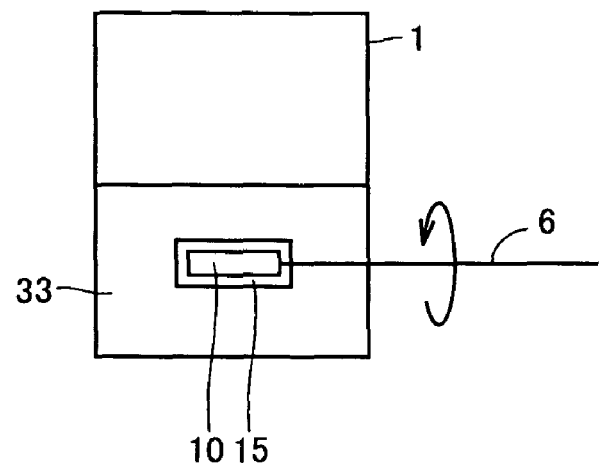
FIG. 3F is a schematic diagram of yet another method of stirring the melt by utilizing rotation of the underlying substrate and the group III-nitride semiconductor crystal that grows on the underlying substrate.

The GaN substrate in a hexagonal columnar shape having a distance between each corner and the center of the hexagonal plane of 1 mm and a length of 2 mm was employed as underlying substrate 10, and the GaN substrate was placed as shown in FIG. 3F using a normal line passing through the center of the hexagonal plane of the GaN substrate as rotation axis 6. Initially, the GaN substrate was rotated at 10 rpm for 1 hour at a melt temperature of 650° C., so as to stir the melt. Thereafter, while the melt was being stirred with the GaN substrate being rotated at 3 rpm at a melt temperature of 800° C., crystal growth was performed for 100 hours. Except for these conditions, the group III-nitride semiconductor crystal was grown as in Example 5 and GaN crystal having a thickness of 600 μm was obtained. The GaN crystal attained the absorption coefficient, at a wavelength of 375 nm, of 29 cm$^{-1}$, and attained the absorption coefficient, at a wavelength of 500 nm, of 7 cm$^{-1}$. In addition, the GaN crystal substrate obtained by cutting the GaN crystal to a thickness of 350 µm was used to fabricate the group III-nitride semiconductor device, as in Example 1. This device attained the light emission peak wavelength of 450 nm, and the relative light emission intensity of 1.3. The result is summarized in Table 2.

Comparative Example 1

The group III-nitride semiconductor crystal was grown as in Example 5, except that the GaN/S substrate in which the GaN crystal layer was formed to a thickness of 3 µm on the surface of the sapphire substrate having a size of 18 mm×20 mm×400 µm thickness with MOCVD was employed as underlying substrate 10 and except that melt 23 was not stirred. GaN crystal having a thickness of 230 µm was thus obtained. The GaN crystal attained the absorption coefficient, at a wavelength of 375 nm, of 105 cm$^{-1}$, and attained the absorption coefficient, at a wavelength of 500 nm, of 26 cm$^{-1}$. In addition, the GaN crystal substrate obtained by cutting the GaN crystal to a thickness of 200 µm was used to fabricate the group III-nitride semiconductor device, as in Example 1. This device attained the light emission peak wavelength of 450 nm, and the relative light emission intensity of 1.0. The result is summarized in Tables 1 and 2.

TABLE 1

|  |  | Example 1 | Example 2 | Example 3 | Example 4 | Example 5 | Example 6 | Example 7 | Comparative Example 1 |
|---|---|---|---|---|---|---|---|---|---|
|  | Underlying substrate | GaN/S | GaN/S | GaN | GaN/S | GaN | GaN/S | GaN/S | GaN/S |
| Material for crystal | Form of material for III-alkali element | Ga$_{39}$Na$_{22}$ | Ga$_4$Na | GaLi$_2$ | Al$_2$Li$_3$ | Ga, Na | Ga, Na | Ga, Na | Ga, Na |
|  | Composition (atomic %) | Ga (64) Na (36) | Ga (80) Na (20) | Ga (33) Li (67) | Al (40) Li (60) | Ga (64) Na (36) | Ga (64) Na (36) | Ga (64) Na (36) | Ga (64) Na (36) |
|  | Form of nitrogen | N$_2$ | N$_2$ | N$_2$ | N$_2$ | N$_2$ | N$_2$ | N$_2$ | N$_2$ |
| Heat treatment | Degree of vacuum (Pa) | 133 | 133 | 133 | 133 | — | — | — | — |
|  | Temperature (° C.) | 300 | 300 | 130 | 130 | — | — | — | — |
|  | Duration (hr) | 0.5 | 0.5 | 1.0 | 1.0 | — | — | — | — |
| Stirring of melt | Method | — | — | — | — | Propeller (30 rpm) | Rotation of reactor (20 rpm) | Gas bubbling (0.3 sccm) | — |
|  | Duration (hr) | — | — | — | — | 0.5 | 1.0 | 1.0 | — |
| Condition for crystal growth | Temperature (° C.) | 800 | 800 | 800 | 950 | 800 | 800 | 800 | 800 |
|  | Pressure (MPa) | 5 | 5 | 5 | 10 | 5 | 5 | 5 | 5 |
|  | Duration (hr) | 50 | 50 | 50 | 50 | 50 | 50 | 50 | 50 |
| Crystal | Chemical composition | GaN | GaN | GaN | AlN | GaN | GaN | GaN | GaN |
|  | Thickness (µm) | 510 | 440 | 490 | 270 | 360 | 320 | 340 | 230 |
| Absorption coefficient (cm$^{-1}$) | 375 nm | 28 | 36 | 30 | 4 | 32 | 33 | 32 | 105 |
|  | 500 nm | 4 | 9 | 6 | 2 | 7 | 7 | 8 | 26 |
| Relative light emission intensity |  | 1.3 | 1.2 | 1.2 | 1.3 | 1.3 | 1.3 | 1.2 | 1.0 |

TABLE 2

|  |  | Example 8 | Example 9 | Example 10 | Example 11 | Example 12 | Example 13 | Comparative Example 1 |
|---|---|---|---|---|---|---|---|---|
| Underlying substrate |  | GaN/S | GaN | GaN/S | GaN | GaN | GaN | GaN/S |
| Material for crystal | Form of material for III-alkali element | Ga$_{39}$Na$_{22}$, Na | Ga$_{39}$Na$_{22}$ | Al$_2$Li$_3$ | Ga, Na | Ga, Na | Ga, Na | Ga, Na |
|  | Composition (atomic %) | Ga (50) Na (50) | Ga (64) Na (36) | Al (40) Li (60) | Ga (64) Na (36) | Ga (64) Na (36) | Ga (64) Na (36) | Ga (64) Na (36) |
|  | Form of nitrogen | N$_2$ | N$_2$ | N$_2$ | N$_2$ | N$_2$ | N$_2$ | N$_2$ |
| Heat treatment | Degree of vacuum (Pa) | — | 133 | 133 | — | — | — | — |
|  | Temperature (° C.) | — | 300 | 130 | — | — | — | — |
|  | Duration (hr) | — | 0.5 | 1.0 | — | — | — | — |
| Stirring of melt | Method | Propeller (3 rpm) | Propeller (20 rpm) | Propeller (20 rpm) | Rotation of underlying substrate (10 rpm) | Rotation of underlying substrate (10 rpm) | Rotation of underlying substrate (3 rpm) | — |
|  | Duration (hr) | 50 | 0.5 | 0.5 | 100 | 100 | 100 | — |
| Condition for crystal growth | Temperature (° C.) | 800 | 800 | 950 | 800 | 800 | 800 | 800 |
|  | Pressure (MPa) | 5 | 5 | 10 | 5 | 5 | 5 | 5 |
|  | Duration (hr) | 50 | 50 | 50 | 100 | 100 | 100 | 50 |
| Crystal | Chemical composition | GaN | GaN | AlN | GaN | GaN | GaN | GaN |
|  | Thickness (µm) | 570 | 540 | 290 | 700 | 900 | 600 | 230 |
| Absorption coefficient (cm$^{-1}$) | 375 nm | 30 | 28 | 4 | 30 | 29 | 29 | 105 |
|  | 500 nm | 6 | 4 | 2 | 6 | 7 | 7 | 26 |
| Relative light emission intensity |  | 1.2 | 1.3 | 1.3 | 1.2 | 1.2 | 1.3 | 1.0 |

As can clearly be seen from comparison between Examples 1 to 4 and Comparative Example 1 in Tables 1 and 2, in crystal growth of the group III-nitride semiconductor crystal using the flux method, the group III-nitride semiconductor crystal attaining a small absorption coefficient could efficiently grow by employing the alloy containing the group III-metal element and the alkali metal element as materials for supplying the group III-metal element and the alkali metal element. In addition, the group III-nitride semiconductor crystal attaining a small absorption coefficient could efficiently grow also when the melt of the alloy was stirred (Example 8) and when the reactor accommodating this alloy was subjected to heat treatment and the melt of the alloy was stirred (Examples 9 and 10).

In addition, as can clearly be seen from comparison between Examples 5 to 7, Examples 11 to 13 and Comparative Example 1, in crystal growth of the group III-nitride semiconductor crystal using the flux method, the group III-nitride semiconductor crystal attaining a small absorption coefficient could efficiently grow by stirring and mixing the melt in which the group III-metal-element-containing substance and the alkali-metal-element-containing substance were melted.

Moreover, as can clearly be seen from comparison between Examples 1 to 13 and Comparative Example 1 in Tables 1 and 2, the group III-nitride semiconductor device employing as the substrate the group III-nitride semiconductor crystal according to the present invention attained increased light emission intensity, as compared with the conventional group III-nitride semiconductor device.

The embodiments and examples disclosed above are by way of illustration and are not to be taken by way of limitation, the spirit and scope of the present invention being limited not by the embodiments and examples above but by the claims and intended to include all modifications and variations within the scope of the claims.

INDUSTRIAL APPLICABILITY

As described above, the present invention can widely be utilized in group III-nitride semiconductor crystal attaining a small absorption coefficient and an efficient manufacturing method of the same as well as in a group III-nitride semiconductor device attaining high light emission intensity.

The invention claimed is:

1. A method of manufacturing group III-nitride semiconductor crystal, comprising the steps of:
accommodating an alloy containing at least a group III-metal element and an alkali metal element in a reactor;
introducing a nitrogen-containing substance in said reactor;
dissolving the nitrogen-containing substance in an alloy melt in which said alloy has been melted; and
growing group III-nitride semiconductor crystal, wherein said reactor is evacuated at a degree of vacuum of at most 1330 Pa and is subjected to heat treatment at a treatment temperature of 100 to 500° C. and for a treatment duration of 0.1 to 5 hours after said alloy containing at least the group III-metal element and the alkali metal element is accommodated in said reactor and before said nitrogen-containing substance is introduced in said reactor.

2. The method of manufacturing group III-nitride semiconductor crystal according to claim 1, wherein
said alloy melt in which said alloy has been melted is stirred.

3. The method of manufacturing group III-nitride semiconductor crystal according to claim 2, wherein
stirring is carried out by at least any one of stirring by means of a propeller, stirring by rotating the reactor, stirring by rotating an underlying substrate and the group III-nitride semiconductor crystal that grows on said underlying substrate, and stirring by introducing a gas for stirring.

4. The method of manufacturing group III-nitride semiconductor crystal according to claim 1, wherein
said alloy melt in which said alloy has been melted is stirred.

5. The method of manufacturing group III-nitride semiconductor crystal according to claim 4, wherein
stirring is carried out by at least any one of stirring by means of a propeller, stirring by rotating the reactor, stirring by rotating an underlying substrate and the group III-nitride semiconductor crystal that grows on said underlying substrate, and stirring by introducing a gas for stirring.

6. Group III-nitride semiconductor crystal manufactured with a method of manufacturing group III-nitride semiconductor crystal including the steps of accommodating an alloy containing at least a group III-metal element and an alkali metal element in a reactor, introducing a nitrogen-containing substance in said reactor, dissolving the nitrogen-containing substance in an alloy melt in which said alloy has been melted, and growing group III-nitride semiconductor crystal, wherein said reactor is evacuated at a degree of vacuum of at most 1330 Pa and is subjected to heat treatment at a treatment temperature of 100 to 500° C. and for a treatment duration of 0.1 to 5 hours after said alloy containing at least the group III-metal element and the alkali metal element is accommodated in said reactor and before said nitrogen-containing substance is introduced in said reactor.

7. The group III-nitride semiconductor crystal according to claim 6, attaining an absorption coefficient, in a wavelength range from 375 nm to 500 nm, of at most 50 $cm^{-1}$.

8. A group III-nitride semiconductor device including the group III-nitride semiconductor crystal according to claim 6.

* * * * *